US008649477B2

(12) United States Patent
Matsui

(10) Patent No.: US 8,649,477 B2
(45) Date of Patent: Feb. 11, 2014

(54) LEVEL SHIFTER, INVERTER CIRCUIT, AND SHIFT REGISTER

(71) Applicant: Panasonic Corporation, Osaka (JP)

(72) Inventor: Masafumi Matsui, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/717,855

(22) Filed: Dec. 18, 2012

(65) Prior Publication Data
US 2013/0170607 A1 Jul. 4, 2013

Related U.S. Application Data

(63) Continuation of application No. PCT/JP2011/007356, filed on Dec. 28, 2011.

(51) Int. Cl.
G11C 19/00 (2006.01)

(52) U.S. Cl.
USPC ............ 377/64; 377/77; 377/78; 327/333

(58) Field of Classification Search
None
See application file for complete search history.

(56) References Cited

U.S. PATENT DOCUMENTS

| 3,898,479 | A  | * | 8/1975  | Proebsting     | 326/88  |
|-----------|----|---|---------|----------------|---------|
| 5,949,271 | A  | * | 9/1999  | Fujikura       | 327/390 |
| 7,180,356 | B2 |   | 2/2007  | Kanbara et al. | 327/333 |
| 7,697,655 | B2 | * | 4/2010  | Chan et al.    | 377/64  |
| 7,813,467 | B2 | * | 10/2010 | Chan et al.    | 377/64  |
| 7,834,668 | B2 | * | 11/2010 | Van Acht et al.| 327/108 |
| 8,108,423 | B2 | * | 1/2012  | Treat et al.   | 707/771 |
| 8,208,598 | B2 | * | 6/2012  | Tsai et al.    | 377/64  |
| 2004/0109526 | A1 | * | 6/2004 | Park et al.   | 377/64  |
| 2006/0291610 | A1 | * | 12/2006 | Lo et al.    | 377/64  |
| 2010/0150301 | A1 | * | 6/2010 | Chan et al.   | 377/64  |
| 2010/0309356 | A1 |   | 12/2010 | Ihara et al. |         |
| 2011/0157145 | A1 |   | 6/2011  | Toyoshima et al. |     |

FOREIGN PATENT DOCUMENTS

| JP | 57-180235  | 11/1982 |
| JP | 2008-205767 | 9/2008 |
| JP | 2011-139309 | 7/2011 |

OTHER PUBLICATIONS

IEEE Transactions on Electron Devices, vol. 53, No. 3, to Byung Seong Bae et al., which was published Mar. 2006.
U.S. Appl. No. 13/717,797 to Masafumi Matsui, which was filed Dec. 18, 2012.

* cited by examiner

Primary Examiner — Tuan T Lam
(74) Attorney, Agent, or Firm — Greenblum & Bernstein, P.L.C.

(57) ABSTRACT

A level shifter includes: an input terminal to which an input voltage is applied; a capacitor; a first transistor provided between the input terminal and one of electrodes of the capacitor, and having a gate electrode connected to the other of the electrodes of the capacitor; a second transistor provided between the input terminal and the other electrode of the capacitor; a signal generating unit which generates a signal for switching the second transistor between conduction and non-conduction and supply the signal to the gate electrode of the second transistor, in a period when the input voltage is provided to the input terminal; and an output terminal for outputting a voltage at the other electrode of the capacitor which is level-shifted by a change in the second transistor to a non-conducting state in the period as an output voltage.

8 Claims, 8 Drawing Sheets

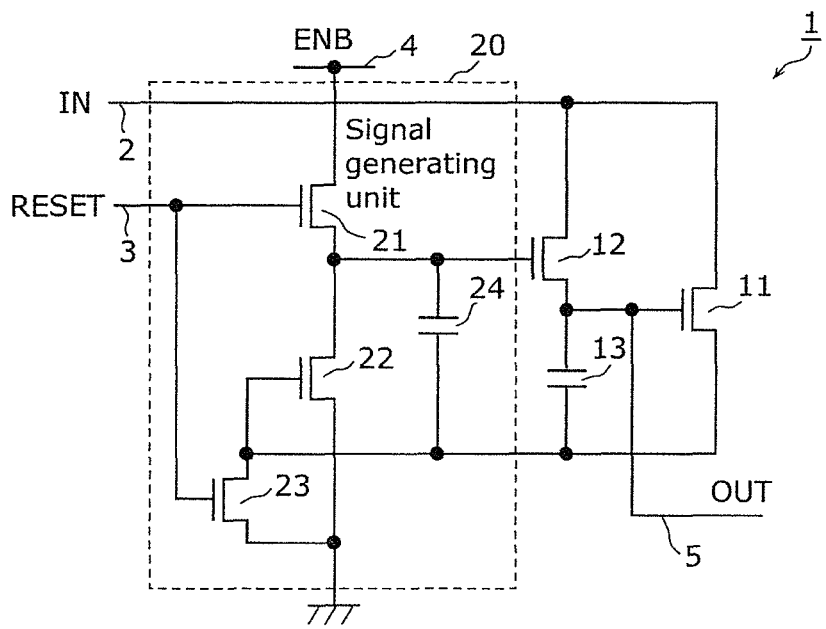
FIG. 1
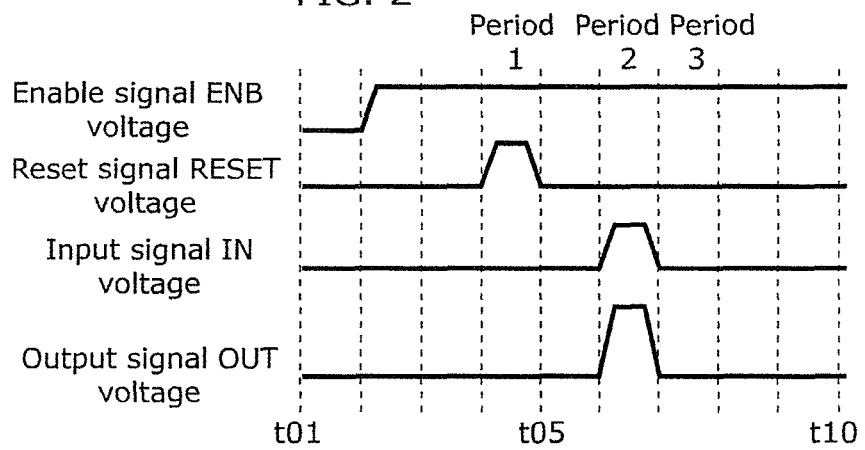
FIG. 2
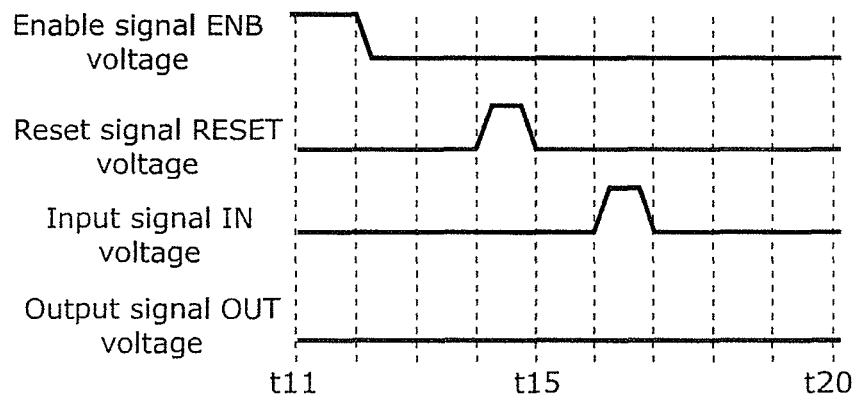

Period 1

When period 2 starts

Period 2

Period 3

LEVEL SHIFTER, INVERTER CIRCUIT, AND SHIFT REGISTER

CROSS REFERENCE TO RELATED APPLICATION

This is a continuation application of PCT Patent Application No. PCT/JP2011/007356 filed on Dec. 28, 2011, designating the United States of America. The entire disclosure of the above-identified application, including the specification, drawings and claims are incorporated herein by reference in their entirety.

TECHNICAL FIELD

One or more exemplary embodiments disclosed herein relate generally to level shifters, inverter circuits, and shift registers, and particularly relates to a level shifter which does not require a dedicated power supply.

BACKGROUND ART

Thin-film transistors (TFT) made of amorphous silicon for selecting pixels are used in a pixel circuit in an active-matrix liquid crystal display and an organic EL display. In order to drive the selecting TFTs, a driver circuit is provided at a periphery of the display. The driver circuit is composed of a logic device for outputting a driving pulse for turning the selecting TFT on or off.

The output voltage of the logic device embedded in a silicon circuit is usually smaller then the driving voltage of the TFT. In this case, a level shifter for boosting the output voltage of the logic device so as to match the output voltage to the driving voltage of the TFT is provided in a driver circuit.

FIG. 8 is a circuit configuration diagram of the conventional level shifter disclosed in the non-patent literature 1. The level shifter 500 illustrated in FIG. 8 includes transistors T1 to T6 which are n-type TFTs and capacitors C1 and C2. The level shifter 500 converts an input signal voltage Vin operating in a voltage amplitude between a fixed voltage VDD1 and a fixed voltage VSS1 to an output signal voltage Vout operating in a voltage amplitude between a fixed voltage VDD2 and a fixed voltage VSS2. With the circuit configuration illustrated in FIG. 8, the level shifter 500 is capable of reducing an output impedance, and performing a boosting operation for boosting a voltage to a voltage twice the original voltage or greater.

The patent literature 1 also discloses a level shifter which is composed of TFTs of a single-conduction type, holds amplitudes of an internal waveform and an output waveform by using an inverted signal of the input, or outputs amplitude larger than the amplitude of the input signal (performing a level shift operation). With this configuration, the patent literature 1 states that a clean internal waveform or output waveform can be achieved while maintaining low power consumption.

The patent literature 2 discloses a level shifter which is composed of TFTs of a single conduction type, avoids reduction in the output waveform or performs a level-shift operation using the inverted signal of the input and the diode connection of the TFT. With this, the patent literature 2 states that an output signal can be formed with low power consumption.

CITATION LIST

Patent Literature

[Patent Literature 1] Japanese Unexamined Patent Application Publication No. 2011-139309

[Patent Literature 2] Japanese Unexamined Patent Application Publication No. 2008-205767

Non Patent Literature

[Non-Patent Literature 1] Byung Seong Bae, et. al., IEEE Tran. Electron Devices, vol 53, No. 3, 2006

SUMMARY

Technical Problem

However, with the level shifter disclosed in the non-patent literature 1, the patent literature 1, and the patent literature 2, a dedicated power supply for providing a level-shifted voltage is necessary. Accordingly, the space necessary for providing the fixed power supply line and others increases. Furthermore, with the configurations, a load on the voltage supply from the external circuit is necessary.

Furthermore, in the non-patent literature 1 and the patent literature 2, the diode connection of the transistor is used. If the transistor has the depletion characteristics, a leakage current is generated, making it unable to obtain the predetermined diode characteristics. This causes a problem of deteriorated boosting characteristics.

One non-limiting and exemplary embodiment provides a level shifter, an inverter circuit, and a shift register which does not require a dedicated power supply, and capable of suppressing the degradation in the boosting characteristics even if the transistor has the depletion characteristics.

Solution to Problem

In one general aspect, the level shifter disclosed here feature a level shifter including: an input terminal to which an input voltage is applied; a first capacitor; a first transistor having a source electrode and a drain electrode that are provided between the input terminal and one of electrodes of the first capacitor, and a gate electrode connected to the other of the electrodes of the first capacitor; a second transistor having a source electrode and a drain electrode that are provided between the input terminal and the other electrode of the first capacitor; a signal generating unit which generates a signal for switching the second transistor between conduction and non-conduction and supply the signal to the gate electrode of the second transistor; and an output terminal for outputting, in a period when the input voltage is provided to the input terminal, a voltage at the other electrode of the first capacitor which is level-shifted as an output voltage.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

According to the configuration described in the present disclosure, the dedicated power supply line is not necessary, which reduces the space for lines and load on the external circuit. Furthermore, the transistor having the diode connection is not used. Accordingly, even if the transistor comprising the circuit has the depletion characteristics, it is possible to suppress the degradation in the boosting characteristics.

BRIEF DESCRIPTION OF DRAWINGS

These and other advantages and features will become apparent from the following description thereof taken in conjunction with the accompanying Drawings, by way of non-limiting examples of embodiments of the present disclosure.

FIG. 1 is a circuit configuration diagram illustrating an example of a level shifter according to the embodiment 1.

FIG. 2 is a timing chart for driving a level shifter according to the embodiment 1.

DESCRIPTION OF EMBODIMENT(S)

Figure 3A:
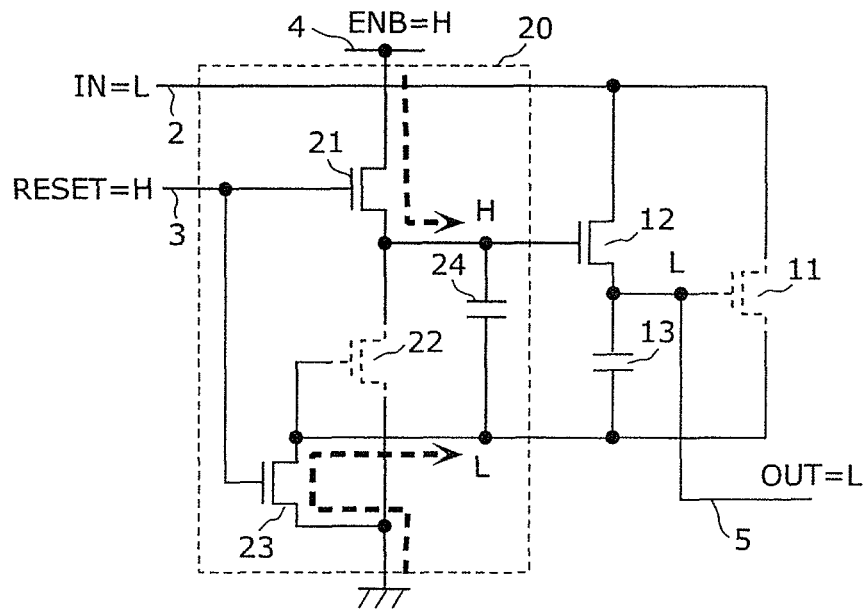
FIG. 3A is a circuit state transition diagram of the level shifter according to the embodiment 1 in the period 1.

The level shifter according to an aspect of the present disclosure is a level shifter including: an input terminal to which an input voltage is applied; a first capacitor; a first transistor having a source electrode and a drain electrode that are provided between the input terminal and one of electrodes of the first capacitor, and a gate electrode connected to the other of the electrodes of the first capacitor; a second transistor having a source electrode and a drain electrode that are provided between the input terminal and the other electrode of the first capacitor; a signal generating unit which generates a signal for switching the second transistor between conduction and non-conduction and supply the signal to the gate electrode of the second transistor; and an output terminal for outputting, in a period when the input voltage is provided to the input terminal, a voltage at the other electrode of the first capacitor which is level-shifted as an output voltage.

With the configuration described above, the first capacitor, the first transistor, and the second transistor which determine potentials at the electrodes of the first capacitor, and the signal generating unit which controls the conduction state of the second transistor are included. With this, it is possible to shift the level of the input voltage. Here, the dedicated power supply line for the level shift operation is not necessary. Accordingly, it is possible to reduce the space for the lines and the load on the external circuit.

In the level shifter according to an aspect of the present disclosure, a voltage corresponding to the input voltage may be charged in the first capacitor in a period when the input voltage is provided to the input terminal and when the second transistor is in a conducting state by the signal generating unit, and the input voltage may be applied to the one electrode of the first capacitor through the first transistor set to be in a conducting state by an application of the input voltage to the gate electrode, and the output voltage having a voltage amplitude greater than the input voltage may be generated in the other electrode of the first capacitor by the signal generating unit setting the second transistor in a non-conducting state in response to the application of the input voltage to the one electrode of the first capacitor, and the output voltage may be provided from the output terminal.

In the level shifter according to an aspect of the present disclosure, the signal generating unit may further include: a control terminal to which a control signal for generating the output voltage is applied; a reset terminal to which a reset signal for resetting a circuit state is applied; a second capacitor connected between the gate electrode of the second transistor and the one electrode of the first capacitor; a third transistor having a gate electrode connected to the reset terminal, one of a source electrode and a drain electrode connected to the control terminal, and the other of the source electrode and the drain electrode connected to the gate electrode of the second transistor; a fourth transistor having a gate electrode connected to the one electrode of the first capacitor, one of a source electrode and a drain electrode connected to the gate electrode of the second transistor, and the other of the source electrode and the drain electrode connected to a reference terminal; and a fifth transistor having a gate electrode connected to the reset terminal, one of a source electrode and a drain electrode connected to the one electrode of the first capacitor, and the other of the source electrode and the drain electrode connected to the reference terminal.

With this, in the circuit configuration, the diode-connection TFT is not used, and the second transistor can be set to a sufficient reverse-bias state. Accordingly, even if the second transistor has the depletion characteristics, it is possible to securely set the second transistor in the non-conducting state in the boosting process. Therefore, it is possible to suppress the degradation in the boosting characteristics.

In the level shifter according to an aspect of the present disclosure, the first to fifth transistors are n-type thin-film transistors, for example.

In the level shifter according to an aspect of the present disclosure, the first to fifth transistors are p-type thin-film transistors, for example.

With these characteristics, the fabrication process of the level shifter is simplified, improving the fabrication yield.

The present disclosure may not only be implemented as a level shifter having the characteristic units, but also as an inverter circuit including the level shifter.

The inverter circuit according to an aspect of the present disclosure may be an inverter circuit including: the level shifter; an inverter input terminal to which two types of input voltages representing logic states are provided; an inverter output terminal which outputs an output voltage representing one of logic states obtained by inverting the logic states represented by the two types of the input voltages; a first reference line for supplying a first reference voltage representing one of the logic states; a second reference line for supplying a second reference voltage representing the other of the logic states; a first input transistor having (i) a gate electrode and (ii) one of a source electrode and a drain electrode that are connected to the first reference line, and the other of the source electrode and the drain electrode connected to the input terminal of the level shifter; a second input transistor having a gate electrode connected to the inverter input terminal, one of a source electrode and a drain electrode connected to the input terminal, and the other of the source electrode and the drain electrode connected to the second reference line; a first output transistor having a gate electrode connected to the output terminal of the level shifter, one of a source electrode and a drain electrode connected to the first reference line, and the other of the source electrode and the drain electrode connected to the inverter output terminal; and a second output transistor having a gate electrode connected to the inverter input terminal, one of a source electrode and a drain electrode connected to the inverter output terminal, and the other of the source electrode and the drain electrode connected to the second reference line, in which the inverter input terminal is further connected to the reset terminal of the level shifter, and the first reference line is further connected to the control terminal of the level shifter.

With this configuration, the level shifter provided between the input unit including the first input transistor and the second input transistor and the output unit including the first output transistor and the second output transistor suppresses the attenuation of the output amplitude, improving the anti-depletion characteristics.

The present disclosure may not only be implemented as the level shifter having the characteristic units, but also as a shift register including the level shifter.

By including the level shifter according to an aspect of the present disclosure which shifts the level of the clock signal and supplies the level-shifted clock signal to the shift register, the shift register can maintain the level of the signal voltage of the input signal and the output signal transmitted between the unit circuits configuring the shift register at high level without attenuation. With this, it is possible to reduce the on-resistance of the TFTs configuring the shift register. Accordingly, the transient characteristics of the output signal are improved, improving the transfer efficiency of the signals.

The following shall specifically describe a level shifter, an inverter circuit, and a shift register according to an aspect of the present disclosure with reference to the drawings.

Note that, the following embodiments are specific examples in the present disclosure. Numbers, shapes, materials, elements, arrangement of the elements and connections between the elements are mere examples, and not intended to limit the scope of the present disclosure. Furthermore, among the elements in the embodiments, elements not recited in an independent claim directed to the most generic concept shall be illustrated as optional elements.

(Embodiment 1)

FIG. 1 is a circuit configuration diagram illustrating an example of a level shifter according to the embodiment 1. The level shifter in FIG. 1 includes a first transistor 11, a second transistor 12, a capacitor 13, and a signal generating unit 20. The level shifter 1 shifts the level of the input signal IN by providing an input of a reset signal RESET which is an external control signal from a reset signal line 3 and an input of an enable signal ENB which is an external control signal from an enable signal line 4 with a predetermine timing, and outputs an output signal OUT.

The capacitor 13 is the first capacitor having one electrode connected to a source terminal of the first transistor 11, and the other electrode connected to a source terminal of the second transistor 12, a gate terminal of the first transistor 11, and an output terminal through an output line 5. With this, a level of the output from the level shifter 1 is determined by a potential at the other electrode of the capacitor 13.

The first transistor 11 is the first transistor having a gate terminal connected to the other electrode of the capacitor 13, a drain electrode connected to an input terminal through an input line 2, and a source terminal connected to the one electrode of the capacitor 13 and the signal generating unit 20.

The second transistor 12 is the second transistor having a gate terminal connected to the signal generating unit 20, a drain terminal connected through the input terminal through the input line 2, and a source terminal connected to the output terminal through the other electrode of the capacitor 13 and the output line 5.

The signal generating unit 20 includes, for example, transistors 21, 22, and 23, and a capacitor 24, and outputs a predetermined voltage to the gate terminal of the second transistor 12, according to the enable signal ENB, the reset signal RESET, and the input signal IN. With this, the potential at the other electrode of the capacitor 13 which determines an output level of the level shifter 1 changes depending on the output from the signal generating unit 20, the input signal IN, and the conduction state of the first transistor 11 and the second transistor 12. The following shall describe an example of the connecting relationship between the elements of the signal generating unit 20.

The transistor 21 is the third transistor having a gate terminal connected to the reset terminal through the reset signal line 3, a drain terminal connected to the enable terminal through the enable signal line 4, and a source terminal connected to the gate terminal of the second transistor 12.

The transistor 22 is the fourth transistor having a gate terminal connected to the source terminal of the first transistor 11 and the one electrode of the capacitor 13, a drain terminal connected to the source terminal of the transistor 21, and a source terminal connected to a ground terminal.

The transistor 23 is the fifth transistor having a gate terminal connected to the reset terminal through the reset signal line 3, a drain terminal connected to the gate terminal of the transistor 22, and a source terminal connected to the ground terminal which is the reference terminal.

The capacitor 24 is the second capacitor having one electrode connected to the gate terminal of the second transistor 12, the source terminal of the transistor 21, and the drain terminal of the transistor 22, and other electrode connected to the source terminal of the first transistor 11, the one electrode of the capacitor 13, the gate terminal of the transistor 22, and the drain terminal of the transistor 23.

In the circuit configuration described above, the first transistor 11, the second transistor 12, the transistor 21, the transistor 22, and the transistor 23 are composed of n-type TFTs, for example. This simplifies the fabrication process of the level shifter, and improves the fabrication yield.

With the circuit configuration of the signal generating unit 20 described above, the signal generating unit 20 generates a signal for setting the second transistor 12 to be in the conducting state and supplies the signal to the gate electrode of the second transistor 12 in the period 1 which is a period before an input voltage is provided to the input terminal, and generates a signal for changing the state of the second transistor 12 from the conducting state to a non-conducting state and supplies the signal to the gate electrode of the second transistor 12 in the period 2 in which the input voltage is provided to the input terminal. With this, a voltage at the other electrode of the capacitor 13 which is level-shifted is provided to the output terminal after the second transistor 12 is changed to be in the non-conducting state. The following shall describe specific operations in the periods with reference to FIG. 2 and FIG. 3A to FIG. 3D.

FIG. 2 is a timing chart for driving the level shifter 1 according to the embodiment 1. FIG. 2 illustrates voltage levels of the enable signal ENB, the reset signal RESET, the input signal IN, and the output signal OUT, which are control signals for driving the level shifter 1. The boosting operation is performed from a time t01 to a time t10 (the upper timing chart), and the voltage maintaining operation and the boosting operation are not performed from a time t11 to a time t20 (the lower timing chart). More specifically, the boosting operation is performed when the enable signal ENB is in the high level as in the period from the time t01 to the time t10, and the voltage maintaining operation and the boosting operation are not performed when the enable signal ENB is in the low level, as in the period from the time t11 to the time t20. The following shall describe the circuit operation particularly focusing on the period 1 to the period 4.

First, as the premise of the period 1 to the period 4, the enable signal ENB is in the high level.

Next, in the period 1, the voltage of the reset signal RESET is set to be in the high level.

FIG. 3A is a circuit state transition diagram of the level shifter according to the embodiment 1 in the period 1. In the period 1, the reset signal RESET changes to the high level, setting the transistor 21 to be in the conducting state. Since the transistor 21 is in the conducting state, and the enable signal ENB has been in the high level since the time before the period 1, the potential at the one electrode of the capacitor 24 is in the high level. Furthermore, the reset signal RESET is in the high level, which sets the transistor 23 to be in the conducting state. Since the transistor 23 is in the conducting state and the source terminal of the transistor 23 is grounded, the potential at the other electrode of the capacitor 24 is in the low level. With the operation described above, the capacitor 24 is charged with a voltage corresponding to the power supply voltage (a potential difference between the high level and the low level). Subsequently, the high voltage is applied to the gate terminal of the second transistor 12, setting the second transistor 12 to be in the conducting state. To put it differently, in the period 1, the capacitor 24 is charged with the voltage corresponding to the power supply voltage. Accordingly, the second transistor 12 remains in the conducting state until the boosting operation starts. Here, the low voltage of the input signal IN is applied to the output terminal through the second transistor 12, and thus the output signal OUT is in the low level. At the end of the period 1, the reset signal RESET is in the low level. However, the conducting state of the second transistor 12 is maintained by the voltage holding operation by the capacitor 24.

Next, a high voltage which is the input voltage is applied as the input signal IN in the period 2.

Figure 3B:
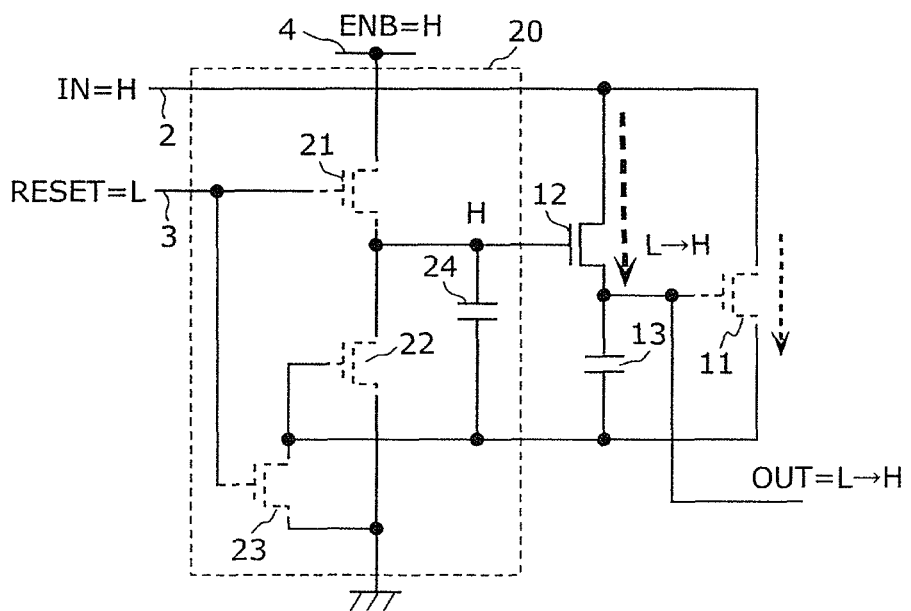
FIG. 3B is a circuit state transition diagram of the level shifter according to the embodiment 1 when the period 2 starts.

FIG. 3B is a circuit state transition diagram of the level shifter according to the embodiment 1 when the period 2 starts. Since the period 1, the conducting state of the second transistor 12 is maintained. Since the input signal changes to the high voltage, the output signal OUT gradually changes from the low level to the high level. Corresponding to this change, the gate voltage in the first transistor 11 gradually increases, and thus, the conductance between the drain and the source of the first transistor 11 gradually increases as well. With this, current gradually starts flowing from the input terminal side to the side of the one electrode of the capacitor 13 through the first transistor 11.

Figure 3C:
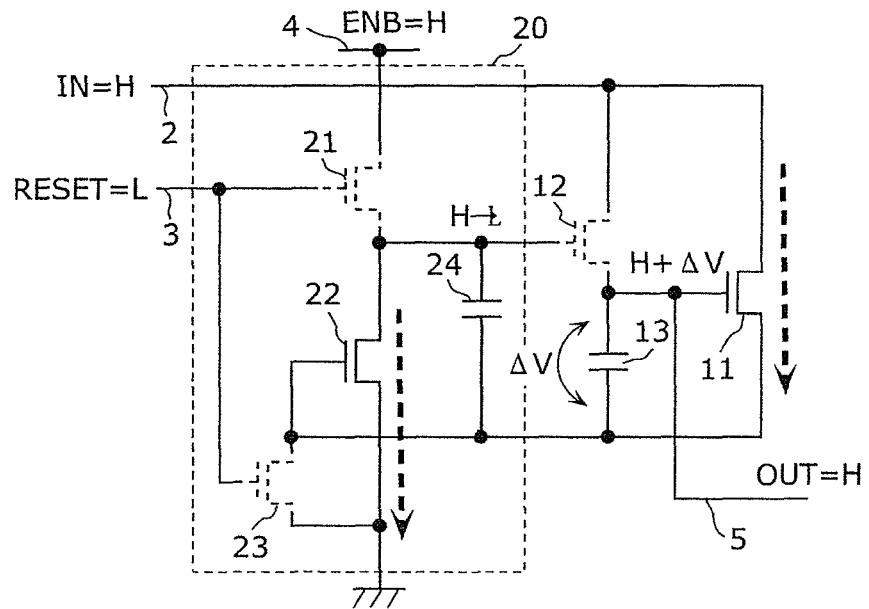
FIG. 3C is a circuit state transition diagram of the level shifter according to the embodiment 1 in the period 2.

FIG. 3C is a circuit state transition diagram of the level shifter according to the embodiment 1 in the period 2. With the current from the input terminal side to the side of the one electrode of the capacitor 13 started flowing through the first transistor 11 when the period 2 starts, the high voltage of the input signal IN is transmitted to the one electrode of the capacitor 13 in the steady state of the period 2, changing the potential at the electrode to the high level. With this, the high voltage is applied to the gate terminal of the transistor 22 connected to the one electrode of the capacitor 13, setting the transistor 22 to be in the conducting state. Here, a discharge current flows from the one electrode of the capacitor 24 to the ground terminal through the transistor 22, and the potential at the one electrode of the capacitor 24 and the gate terminal of the second terminal 12 drops from the high level to the low level. With this, the second transistor 12 changes to be in the non-conducting state.

Here, in a period from the time when the input signal IN changes to the high level while the second transistor 12 is in the conducting state and when the period 2 starts, to the time when the second transistor 12 changes to the non-conducting state, the capacitor 13 is charged with a voltage depending on the high voltage of the input signal IN. Here, at the point in time when the second transistor 12 changes to be in the non-conducting state, the potential at the one electrode of the capacitor 13 increases to the high level (referred to as the voltage H), and thus an thus the voltage at the other electrode of the capacitor 13 and the output terminal is (H+ΔV), where ΔV denotes a charged voltage in the capacitor 13 in the period. To put it differently, the boosting operation by the capacitor 13 is performed when the first transistor 11 changes to be in the conducting state in the period 2. At the same time, the transistor 22 changes to be in the conducting state, and the second transistor 12 changes to be in the non-conducting state in the process of the boosting operation. The boosting operation is complete in this stage. Through the charging operation and the boosting operation, the voltage H of the input signal IN is boosted to the voltage (H+ΔV) of the output signal OUT.

More specifically, in the period in which the high voltage which is the input voltage of the input signal IN is provided to the input terminal when the second transistor 12 is in the conducting state in the signal generating unit 20, a voltage corresponding to the high voltage is charged in the capacitor 13, and the high-voltage is applied to the one electrode of the capacitor 13 through the first transistor 11 set to be in the conducting state by the application of the high voltage to the gate electrode. In contrast, the signal generating unit 20 sets the second transistor 12 to be in the non-conducting state in response to the application of the high voltage to the one electrode of the capacitor 13. With this, the signal generating unit 20 generates the output voltage having voltage amplitude larger than the high voltage on the other electrode of the capacitor 13, and outputs the output voltage from the output terminal.

Next, the voltage of the input signal IN has already changed to the low voltage in the period 3.

Figure 3D:
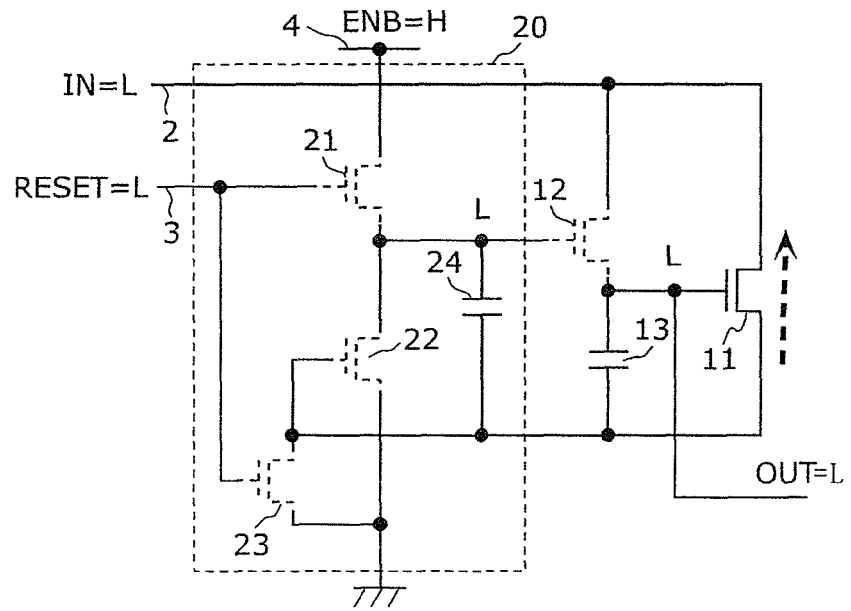
FIG. 3D is a circuit state transition diagram of the level shifter according to the embodiment 1 in the period 3.

FIG. 3D is a circuit state transition diagram of the level shifter according to the embodiment 1 in the period 3. Due to the potential change in the input signal IN, the potential at the source terminal and the drain terminal of the first transistor 11 is reversed after the period 2 ends and current flows from the side of one electrode of the capacitor 13 to the input terminal side through the first transistor 11 in the period 3. With the current flow and that the gate terminal of the first transistor 11 is electrically blocked by the non-conducting state of the second transistor 12 an the capacitor 13, the gate voltage of the first transistor 11 is discharged to the input terminal side, consequently setting the voltage of the output signal OUT to be in the low level.

As described above, the level shifter 1 according to the embodiment 1 includes the capacitor 13 having charging function, the first transistor 11 and the second transistor 12 which determine the potentials at the electrodes of the capacitor 13, and the signal generating unit 20 which controls the conduction state of the second transistor 12, and allows boosting the input signal IN by the supply of the enable signal ENB and the reset signal RESET with the predetermined timing. Since the level shifter 1 has the configuration described above, a dedicated power supply line for the level-shift operation is not necessary, allowing reduction on the space for the lines and the load on the external circuit. Furthermore, since the circuit is configured such that the TFT of diode connection is not used and the second transistor 12 is set to a sufficient reverse-bias state, the second transistor 12 may be securely set to be in the non-conducting state in the boosting process even if the second transistor 12 has the depletion characteristics. Accordingly, it is possible to suppress the degradation in the boosting characteristics.

(Embodiment 2)

In the embodiment 2, an inverter circuit including a logic inverting unit which inverts logic of an input signal and the level shifter 1 described in the embodiment 1 shall be described.

Figure 4A:
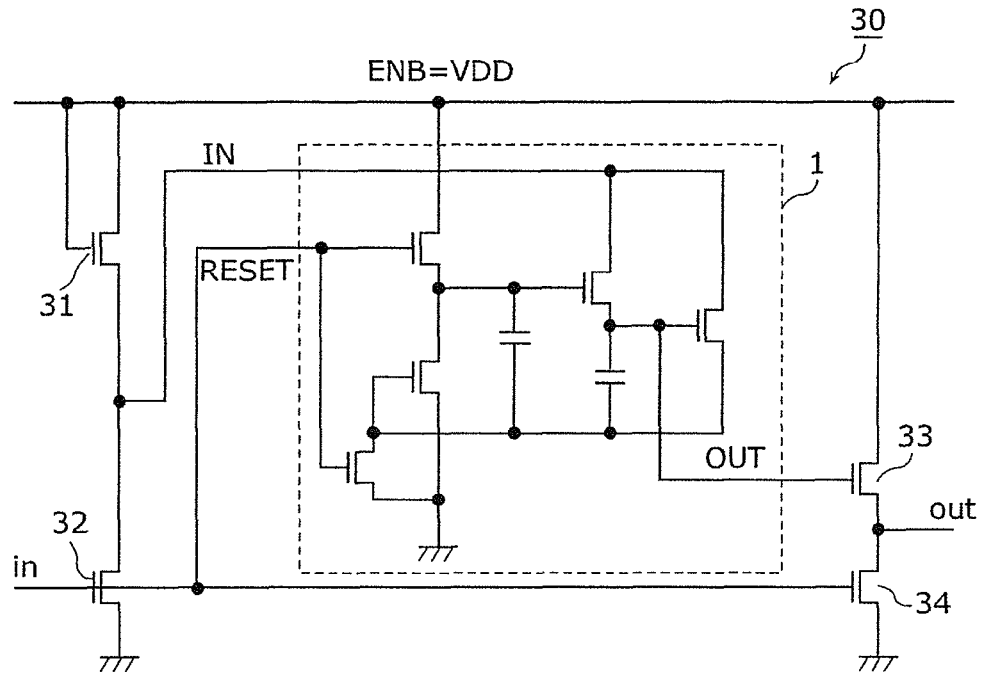
FIG. 4A is a circuit configuration diagram of an inverter circuit according to the embodiment 2.

FIG. 4A is a circuit configuration diagram of an inverter circuit according to the embodiment 2. The inverter circuit 30 in FIG. 4A includes transistors 31 and 32 composing an input unit, transistors 33 and 34 composing an output unit, and a level shifter 1 provided between the input unit and the output unit.

The transistor 31 is the first input transistor having a gate electrode and a drain electrode connected to a first reference line to which a first reference voltage (VDD) indicating one of logic states is supplied, and a source electrode connected to the input terminal of the level shifter 1.

The transistor 32 is the second input transistor having a gate electrode connected to an inverter input terminal to which two types of input voltages indicating logic states are provided, a drain electrode connected to the input terminal, and a source electrode connected to a second reference line to which a second reference voltage (VSS) representing the other logic state is supplied.

The transistor 33 is the first output transistor having a gate electrode connected to the output terminal of the level shifter 1, a drain electrode connected to the first reference line, and a source electrode connected to an inverter output terminal for outputting an output voltage representing a logic state obtained by inverting the logic state indicated by the two types of input voltages.

The transistor 34 is the second output transistor having a gate electrode connected to the inverter input terminal, a drain electrode connected to the inverter output terminal, and a source electrode connected to the second reference line.

The inverter input terminal is connected to the reset signal line 3 in the level shifter 1, and the first reference line is connected to the enable signal line 4 of the level shifter 1.

Figure 4B:
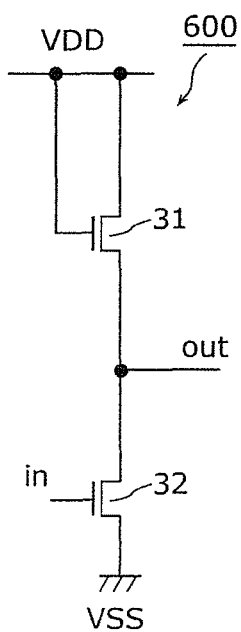
FIG. 4B is a circuit configuration diagram of a conventional inverter circuit which is a first comparative example.
Figure 4C:
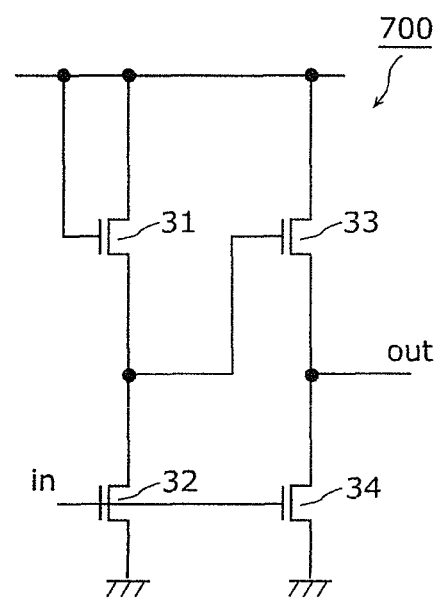
FIG. 4C is a circuit configuration diagram of a conventional inverter circuit which is a second comparative example.

FIG. 4B is a circuit configuration diagram of a conventional inverter circuit illustrating the first comparative example, and FIG. 4C is a circuit configuration diagram of a conventional inverter circuit illustrating the second comparative example.

The conventional inverter circuit 600 illustrated in FIG. 4B includes an n-type transistor 31 having diode connection and an n-type transistor 32 having a gate terminal to which an input signal in is applied which are connected in series, and provides an output signal out from a connecting point of the transistors 31 and 32. With the configuration illustrated above, when the input signal in is in high voltage (VDD), the transistor 32 is in the conducting state, and the output signal out through the transistor 32 is in low voltage (VSS). In contrast, when the input signal in is in low voltage (VSS), the transistor 32 is set to be in the non-conducting state, and the output signal out through the transistor 31 is in high voltage (VDD).

A conventional inverter circuit 700 illustrated in FIG. 4C is different from the inverter circuit 600 in that the input unit and the output unit are included. The relationship between the input and the output in this configuration is the same as the relationship between the input and the output in the inverter circuit 600. More specifically, when the input signal in is in high voltage (VDD), the transistor 32 is set to be in the conducting state, and low voltage is applied to the gate of the transistor 33 through the transistor 32, setting the transistor 33 to be in the non-conducting state. Meanwhile, the transistor 34 is set to be in the conducting state, setting the output signal out in low voltage (VSS). In contrast, when the input signal in is in low voltage (VSS), the transistor 32 is in the non-conducting state. Accordingly, high voltage is applied to the gate of the transistor 33 through the transistor 31, setting the transistor 33 to be in the conducting state. Here, the transistor 34 is in the non-conducting state, and the output signal out is in high voltage (VDD).

Figure 5:
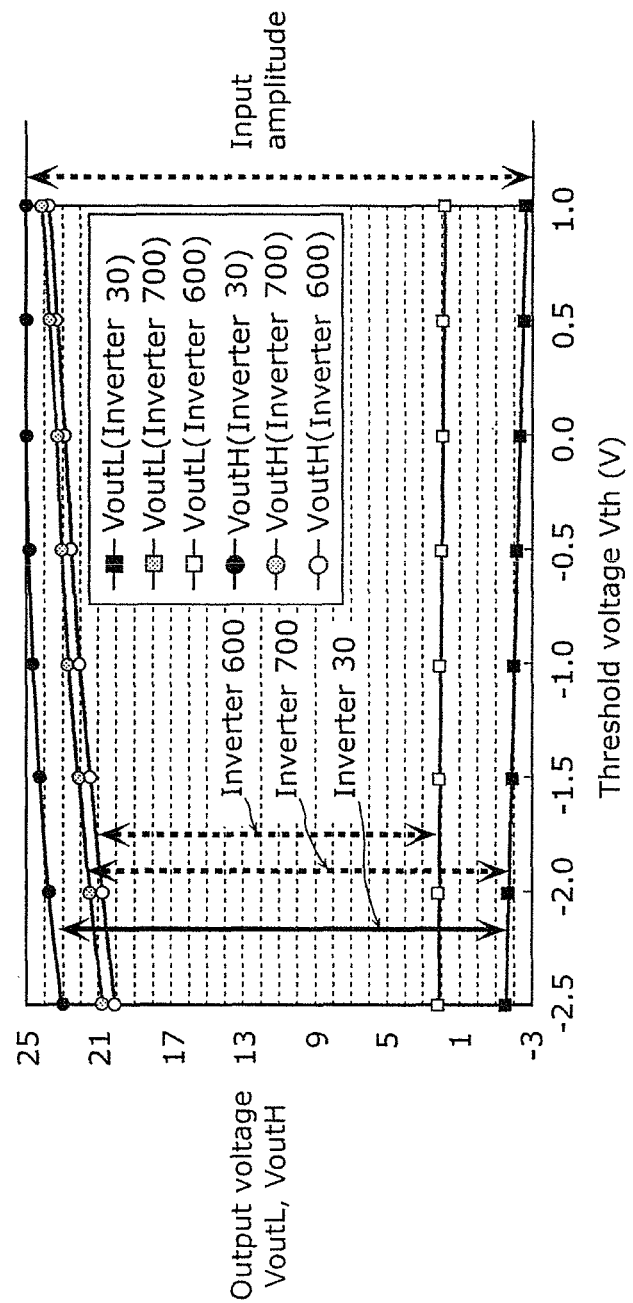
FIG. 5 is a graph illustrating a comparison in relationships between threshold voltages and output voltages of transistors in the inverter circuit according to the present disclosure and the conventional inverter circuit.

FIG. 5 is a graph illustrating relationship between the threshold voltages of transistors and output voltages in the inverter circuit according to the present disclosure and the inverter circuits according to the conventional art. The horizontal axis in FIG. 5 represents threshold voltages of transistors composing the inverter circuits. More specifically, FIG. 5 shows that the smaller the threshold voltage is, the more depleted the transistor becomes, and that the larger the threshold is, the more enhanced characteristics of the transistor becomes. The horizontal axis in FIG. 5 represents high voltage (VoutH) and low voltage (VoutL) in the output signal out from the inverter circuits when the high voltage is 25 V and the low voltage is −3V, as the input signal in. To put it differently, the graph in FIG. 5 shows dependency of the output amplitude on the threshold voltage when the input amplitude is 28 V.

In the conventional inverter circuits 600 and 700 described above, the more depleted the transistors, the lower the high voltage of the output signal out becomes and the higher the low voltage of the output signal out becomes. This is because, more current flows from the power supply side of the inverter circuit to the ground side the more depleted the characteristics of the transistor, resulting in the degradation of the voltage amplitude of the output signal out.

In the graph in FIG. 5, in the inverter circuit 30 according to the present disclosure, the degradation of the output amplitude in the depleted region is suppressed, compared to the conventional inverter circuits 600 and 700. This is because, since the level shifter 1 is present between the input unit and the output unit, the signal provided from the input unit is the input signal IN to the level shifter 1, and the output signal OUT boosted by the level shifter 1 is provided to the output unit.

As described above, according to the inverter circuit 30 according to the embodiment 2, the level shifter 1 provided between the input unit and the output unit suppresses attenuation in the output amplitude, and improves the anti-depletion characteristics.

Although only some exemplary embodiments of the level shifter, the inverter circuit, and the shift register according to the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

Note that, in the embodiments 1 and 2, all of the transistors composing the level shifter 1 are assumed to be the n-type TFTs.

However, all of the transistors composing the level shifter according to the present disclosure may be p-type TFTs to produce the same effects. The following describes a circuit configuration and driving timing in this case.

Figure 6:
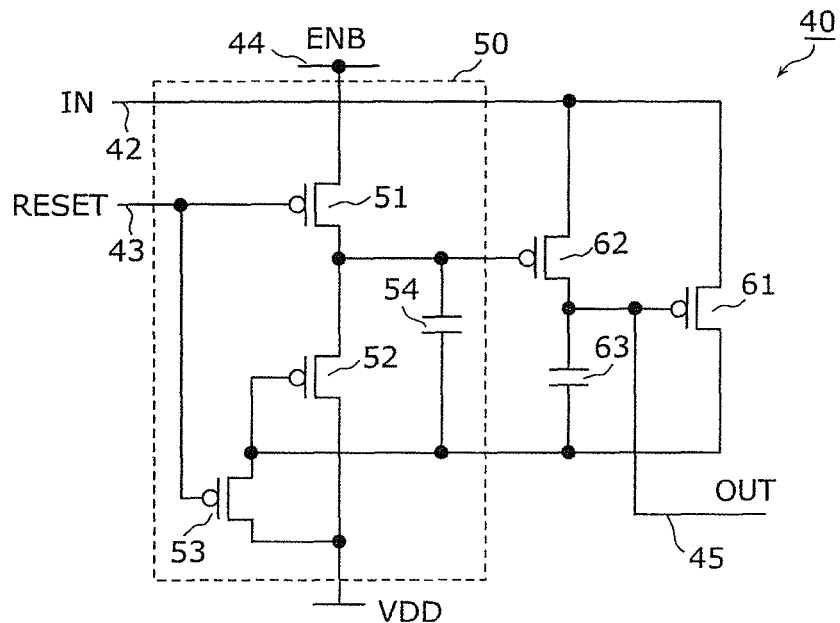
FIG. 6 is a circuit configuration diagram illustrating a variation of the level shifter according to the embodiment 1.

FIG. 6 is a circuit configuration diagram illustrating an example of a variation of the level shifter according to the embodiment 1.

A level shifter 40 in FIG. 6 includes a first transistor 61, a second transistor 62, a capacitor 63, and a signal generating unit 50. The level shifter 40 shifts the level of the input signal IN provided through the input line 42 by the input of a reset signal RESET from a reset signal line 43 and an enable signal ENB from an enable signal line 44 with the predetermined timing, and outputs the output signal OUT from the output line 45.

The signal generating unit 50 includes, for example, transistors 51, 52, and 53, and a capacitor 54, and outputs a predetermined voltage to the gate terminal of the second transistor 62, according to the enable signal ENB, the reset signal RESET, and the input signal IN. With this, the potential at the other electrode of the capacitor 63 which determines an output level of the level shifter 40 changes depending on the output from the signal generating 50, the input signal IN, and the conduction state of the first transistor 61 and the second transistor 62.

The circuit configuration of the level shifter 40 in FIG. 6 is different from the circuit configuration of the level shifter 1 in FIG. 1 in that the conduction type of all of the transistors are of p-type, and the connection between the power supply voltage VDD and the ground voltage VSS is reversed.

Figure 7:
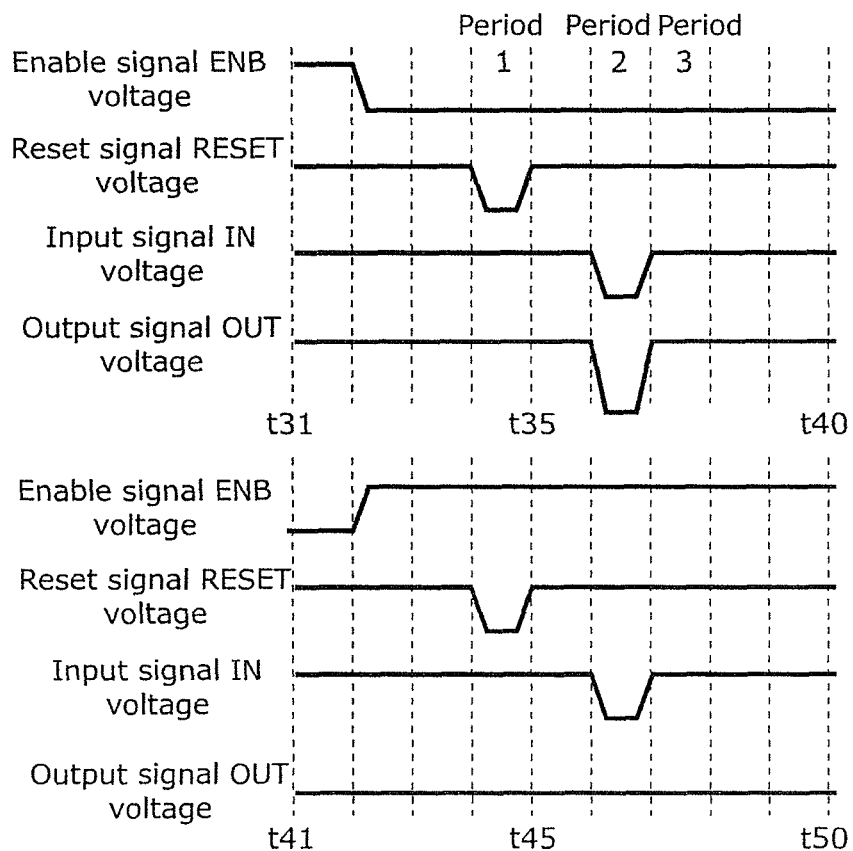
FIG. 7 is a timing chart for driving the variation of the level shifter according to the embodiment 1.
Figure 8:
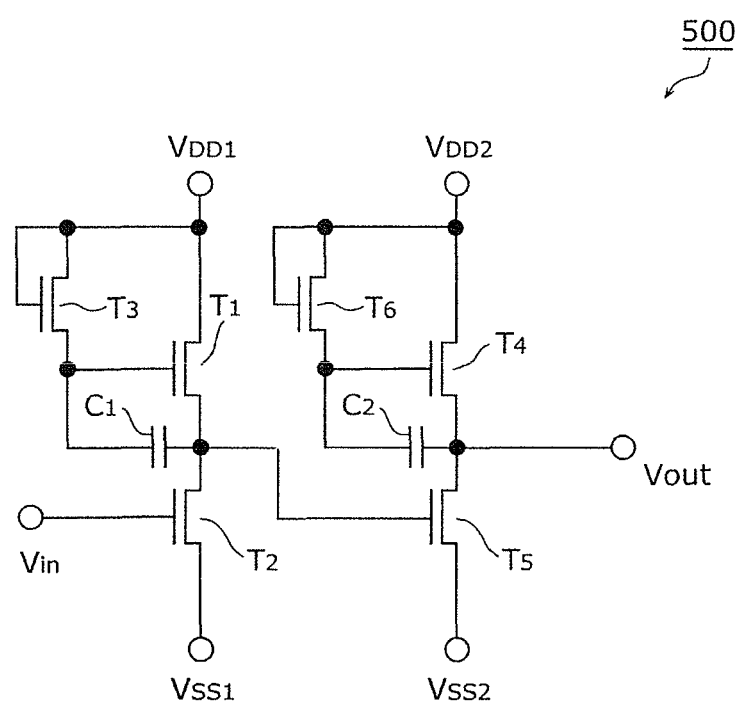
FIG. 8 is a circuit configuration diagram of the conventional level shifter disclosed in the non-patent literature 1.

FIG. 7 is a chart illustrating timing for driving an example of a variation of the level shifter according to the embodiment 1. The driving timing in FIG. 7 is different from the driving timing illustrated in FIG. 2 only in that the voltage levels of the signals are inverted. The circuit operations by the signals are identical to the circuit operations by the level shifter 1 according to the embodiment 1.

A shift register including the level shifter according to the embodiment 1 is also included in the scope of the present disclosure. The shift register including the level shifter according to the present disclosure includes m unit circuits provided corresponding to m rows of pixel rows in the display panel, which are connected by cascade connection, and is usually incorporated in a gate driver circuit. The gate driver circuit is provided, for example, in a frame region at a periphery of the display panel.

The unit circuit in the first row receives an input of clock signal CLK output from a clock signal generator and the input signal IN1 with a predetermined timing, and outputs an output signal OUT1 having a same output period as an on-voltage output period of the input signal IN1 (hereafter referred to as an output period) with a delay of a half of a clock cycle from the input signal IN1. The unit circuit in the second row receives an input of the clock signal CLK and an input signal IN2 which is the same signal as the output signal OUT with the predetermined timing, and outputs an output signal OUT2 having the same output period as the output period of the input signal IN1 with a delay of a half of the clock cycle from the output signal OUT1. Accordingly, the unit circuit in the k-th row receives input of the clock signal CLK and an input signal INk which is the same signal as an output signal OUT(k-1), and outputs an output signal OUTk having a same output period as the output period of the input signal IN1.

By including the level shifter according to the present disclosure which shifts the level of the clock signal CLK and supplies the level-shifted clock signal CLK to the shift register in the shift register having the configuration described above, it is possible to drive the transistors composing the shift register with higher voltage, reducing the on-resistance. Therefore, it is possible to improve the transient characteristics of the output signal OUT, and to improve the signal transfer efficiency by suppressing the attenuation in the signal voltages of the input signal IN and the output signal OUT in the unit circuits.

Industrial Applicability

The level shifter disclosed herein is useful for technical fields such as displays for flat-panel televisions and the personal computers which require large-sized screens and high definition.

The invention claimed is:

1. A level shifter comprising:
an input terminal to which an input voltage is applied;
a first capacitor;
a first transistor having a source electrode and a drain electrode that are provided between the input terminal and one of electrodes of the first capacitor, and a gate electrode connected to the other of the electrodes of the first capacitor;
a second transistor having a source electrode and a drain electrode that are provided between the input terminal and the other electrode of the first capacitor;
a signal generating unit configured to generate a signal for switching the second transistor between conduction and non-conduction and supply the signal to the gate electrode of the second transistor; and
an output terminal for outputting, in a period when the input voltage is provided to the input terminal, a voltage at the other electrode of the first capacitor which is level-shifted as an output voltage,
wherein the signal generating unit further includes:
a control terminal to which a control signal for generating the output voltage is applied;
a reset terminal to which a reset signal for resetting a circuit state is applied;
a second capacitor connected between the ate electrode of the second transistor and the one electrode of the first capacitor;
a third transistor having a gate electrode connected to the reset terminal, one of a source electrode and a drain electrode connected to the control terminal, and the other of the source electrode and the drain electrode connected to the ate electrode of the second transistor;
a fourth transistor having a gate electrode connected to the one electrode of the first capacitor, one of a source electrode and a drain electrode connected to the gate electrode of the second transistor, and the other of the source electrode and the drain electrode connected to a reference terminal; and
a fifth transistor having a gate electrode connected to the reset terminal, one of a source electrode and a drain electrode connected to the one electrode of the first capacitor, and the other of the source electrode and the drain electrode connected to the reference terminal.

2. The level shifter according to claim 1,
wherein a voltage corresponding to the input voltage is charged in the first capacitor in a period when the input voltage is provided to the input terminal and when the second transistor is in a conducting state by the signal generating unit, and the input voltage is applied to the one electrode of the first capacitor through the first transistor set to be in a conducting state by an application of the input voltage to the gate electrode, and the output voltage having a voltage amplitude greater than the input voltage is generated in the other electrode of the first capacitor by the signal generating unit setting the second transistor in a non-conducting state in response to the application of the input voltage to the one electrode of the first capacitor, and the output voltage is provided from the output terminal.

3. The level shifter according to claim 1, wherein the first to fifth transistors are n-type thin-film transistors.

4. The level shifter according to claim 1, wherein the first to fifth transistors are p-type thin-film transistors.

5. An inverter circuit comprising:
a logic inverting unit configured to invert a logic of an input signal; and
the level shifter according to claim 1 which inputs an output signal from the logic inverting unit to the input terminal, shifts a level of the input voltage, and outputs the level-shifted input voltage.

6. An inverter circuit comprising:
the level shifter according to claim 1;
an inverter input terminal to which two types of input voltages representing logic states are provided;
an inverter output terminal which outputs an output voltage representing one of logic states obtained by inverting the logic states represented by the two types of the input voltages;
a first reference line for supplying a first reference voltage representing one of the logic states;
a second reference line for supplying a second reference voltage representing the other of the logic states;
a first input transistor having (i) a gate electrode and (ii) one of a source electrode and a drain electrode that are connected to the first reference line, and the other of the source electrode and the drain electrode connected to the input terminal of the level shifter;
a second input transistor having a gate electrode connected to the inverter input terminal, one of a source electrode and a drain electrode connected to the input terminal, and the other of the source electrode and the drain electrode connected to the second reference line;
a first output transistor having a gate electrode connected to the output terminal of the level shifter, one of a source electrode and a drain electrode connected to the first reference line, and the other of the source electrode and the drain electrode connected to the inverter output terminal; and
a second output transistor having a gate electrode connected to the inverter input terminal, one of a source electrode and a drain electrode connected to the inverter output terminal, and the other of the source electrode and the drain electrode connected to the second reference line, wherein the inverter input terminal is further connected to the reset terminal of the level shifter, and
the first reference line is further connected to the control terminal of the level shifter.

7. A shift register having unit circuits connected in multiple stages and which receives a clock signal and an input signal, and outputs an output signal obtained by shifting the input signal for a predetermined delay time, the shift register comprising
the level shifter according to claim 1 which shifts a level of a clock amplitude of the clock signal as the input voltage, and outputs the level-shifted clock amplitude to at least one of the unit circuits as the output voltage.

8. A level shifter comprising:
an input terminal to which an input voltage is applied;
a first capacitor;
a first transistor having a source electrode and a drain electrode that are provided between the input terminal and one of electrodes of the first capacitor, and a gate electrode connected to the other of the electrodes of the first capacitor;
a second transistor having a source electrode and a drain electrode that are provided between the input terminal and the other electrode of the first capacitor;
a signal generating unit configured to generate a signal for switching the second transistor between conduction and non-conduction and supply the signal to the gate electrode of the second transistor; and
an output terminal for outputting, in a period when the input voltage is provided to the input terminal, a voltage at the other electrode of the first capacitor which is level-shifted as an output voltage,
wherein the first transistor and the second transistor have depletion characteristics,
a voltage corresponding to the input voltage is charged in the first capacitor in a period when the input voltage is provided to the input terminal and when the second transistor is in a conducting state by the signal generating unit, and the input voltage is applied to the one electrode of the first capacitor through the first transistor set to be in a conducting state by an application of the input voltage to the gate electrode, and
the output voltage having a voltage amplitude greater than the input voltage is generated in the other electrode of the first capacitor by the signal generating unit setting the second transistor in a non-conducting state in response to the application of the input voltage to the one electrode of the first capacitor, and the output voltage is provided from the output terminal.

* * * * *